May 9, 1950 R. E. FRANKLIN ET AL 2,507,374

PIEZOELECTRIC CRYSTAL HOLDER

Filed Nov. 26, 1947

INVENTORS
RALPH E. FRANKLIN
WILLIAM A. MILLER
BY Harry Tonicke
ATTORNEY

Patented May 9, 1950

2,507,374

UNITED STATES PATENT OFFICE 2,507,374

PIEZOELECTRIC CRYSTAL HOLDER

Ralph E. Franklin, Patchogue, and William A. Miller, Port Jefferson, N. Y., assignors to Radio Corporation of America, a corporation of Delaware Application November 26, 1947, Serial No. 788,256

7 Claims. (Cl. 171—327)

This invention relates to a new and useful piezoelectric crystal holder for supporting crystals which will oscillate in the length-width mode.

The purpose of this invention is to improve the crystal frequency stability by (1) decreasing the loading due to crystal electrodes (which are normally plated onto the crystal faces), (2) obtaining an unusually high Q factor, (3) improving the temperature frequency characteristics of the holder, and (4) eliminating the electric twinning which is apt to occur due to the local application of heat in the process of soldering wires to the silver plating on the crystal.

A feature of this invention is the improved arrangement of placing the electrodes on auxiliary plates of quartz or ceramic material which are adjacent to the crystal oscillator element instead of plated on the crystal. It has been found that crystals which oscillate in a length-width mode may be clamped between rigid supports at the center of the crystal, provided the axis of clamping is normal to the plane of motion of the crystal. Such a clamping arrangement will load the crystal very little, if the area of clamping is very small in proportion to the area of the crystal.

Piezoelectric crystal oscillators of the above type are sometimes used as primary standards of frequency, or as the frequency control element in crystal driven clocks. For efficient operation, these crystals should have, as nearly as possible, zero temperature coefficient of frequency over a wide range in temperature, and should also have the highest Q possible. A high Q for a crystal oscillator is obtained by several means. (1) After it is ground to as near correct frequency as possible, it is etched in a solution of some fluorine salt to free it from possible loose particles of quartz, loosened in the process of grinding,—this etching also reduces the amount of frequency drift called aging, and (2) keeping the loading of the crystal at a minimum; such as mounting the holder in a vacuum, keeping the clamping area small, and eliminating the loading due to electrodes, as much as possible.

The invention can be more clearly understood by referring to the accompanying drawings, wherein.

Figure 1:
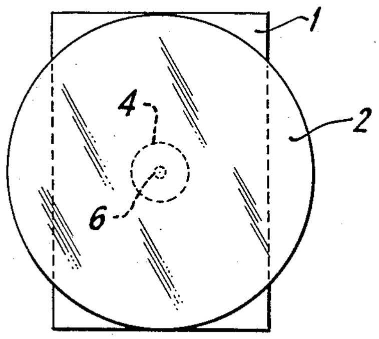
Fig. 1 is an elevation of the crystal holder of this invention.
Figure 2:
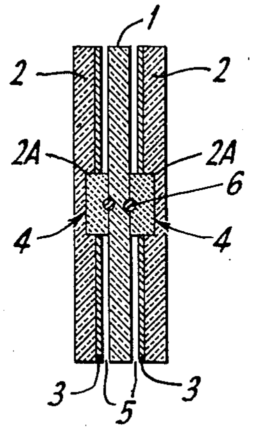
Fig. 2 is a cross-section of Fig. 1.

Referring now in detail to Figs. 1 and 2 of the drawings, the rectangular crystal element 1 is of a type which oscillates in a length-width mode (when the length increases, the width decreases for each half cycle; and the width increases and the length decreases for the other half cycle of an alternating current wave). Circular members 2 are the electrode supports of insulating material, preferably of fused quartz, each support having a depression 2A ground on its inner face for locating the spacing members 4. The electrode supports 2 each have the electrode metal 3 deposited on the inner flat surface by chemical or evaporation means, which process is well known in the art. The spacing members 4 provide an air gap 5 between the crystal and the electrode which is divided equally on each of the two sides of the crystal. The width of the air gap is adjusted by changing the length of the spacing element 4, which is also of insulating material such as crystalline quartz cut of twinned quartz. To prevent any possibility of undesired thickness oscillations occurring in the spacing crystal 4, they are cut from the mother crystal at such an angle that they have the same temperature coefficient of expansion as the crystal element 1. The undesired oscillations are thus prevented as any crystalline quartz which has twinning, either optical or electrical, will not oscillate if the twinned regions are anywhere near equal in area, and in the case of spacing members 4 (which are quite small) almost any amount of twinning will prevent oscillation in such members under any conditions of tuning. If the spacing crystal member 4 is of crystalline quartz cut in this way, it will more nearly retain a constant gap width with changing temperature. Usually, variation in gap width will influence the frequency of the oscillating member 1 by changing the capacity in the equivalent circuit of the crystal. Constant air gap width is desired as it is effective in maintaining a constant frequency.

The surface of the crystal spacing member 4 in contact with the crystal has a small depression which holds a very small piece of insulation material, or an insulating circular bead 6. The insulating material of member 6 may be of fused quartz or ceramic. If the electrode support members 2 are round (as shown in Fig. 1), the small insulation member 6 may be spherical and arranged to fit equally into the depressions in member 4 and the crystal element 1. If the crystal assembly is arranged as shown by Figs. 1 and 2 of the drawings, suitable clamping means are applied to the outer surface of electrode support members 2; the entire assembly may be enclosed within a vacuum chamber (not shown).

Figure 3:
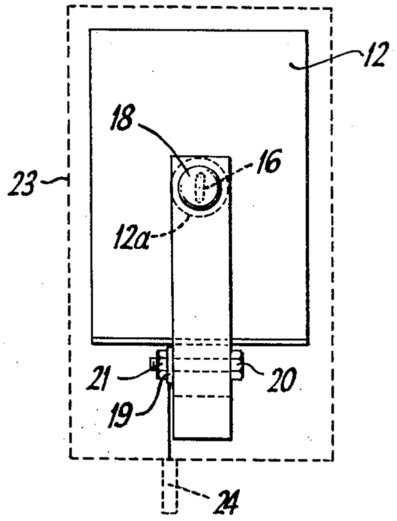
Fig. 3 is an elevation of a modified form of this invention employing rectangular rather than circular electrodes.
Figure 4:
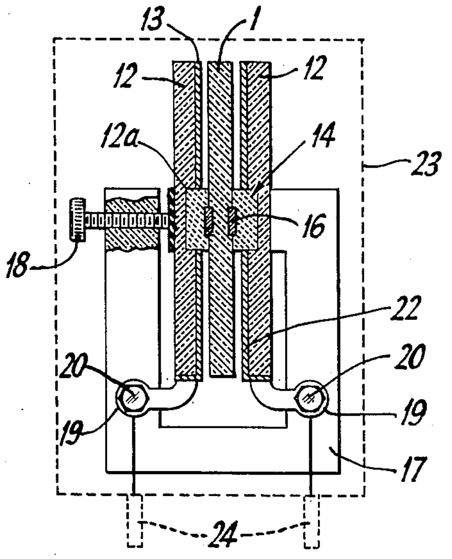
Fig. 4 is a cross-section of Fig. 3.

The modifications of Figs. 3 and 4 show a holder similar to that of Fig. 1 but with rectangular support members 12 and metallized electrodes 13 instead of the circular support members and electrodes. This arrangement will give a somewhat smaller electrical gap capacity, for the reason that the crystal gap capacity is determined by the (1) area of the electrodes facing each other, (2) the distance between the electrodes, and (3) the dielectric constant of the material in the gap, as quartz, air, etc. In the case of the rectangular holder, the total capacity is composed of three capacities in series, that of each air gap and the larger capacity of the crystal itself; while in the case of the circular holder, there are these three capacities in series and the capacity of the two unoccupied regions of this holder in parallel with the overall capacity of the gap. Fig. 4 also shows a mounting means and a means for holding the completed unit together. This mounting means may also be applied to support the structure shown in Figs. 1 and 2, as mentioned above.

Figure 5:
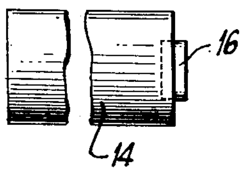
Fig. 5 is an enlarged detail elevation showing the method of supporting the crystal at the central portion thereof.
Figure 6:
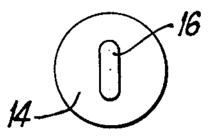
Fig. 6 is a side elevation of Fig. 5.

The electrodes are formed on the surface of support members 12 by suitable chemical or evaporation means. A similar depression 12A is provided on the support members 12 for retaining spacing members 14 therein. Because of the rectangular shape of support members 12, it will be necessary to prevent rotation of the crystal upon the support member. Therefore, the spacing members 14 are provided with a longitudinally shaped bead 16 which fits equally into the slotted depressions in members 14 and the crystal 1, as is shown in Figs. 5 and 6. The mounting means 17 is of insulating material, preferably U-shaped, with an adjustable metallic thumb screw 18 for fixing the pressure necessary to hold the various parts together and to maintain proper clamping pressure. Metal contact springs 19 are secured to the insulating member 17 by means of bolts 20 and nuts 21. The spring contacts 19 make contact with the electrodes 22, and, if desired, they may be soldered to the metallized surface.

In such a type of crystal holder the metal parts that might influence the capacity of the equivalent oscillating circuit have been reduced to a minimum, and by removing the crystal electrodes from the oscillating member, the Q of the crystal will be greatly improved. The complete crystal holder shown in Figs. 3 and 4 is approximately the size of a 100 kilocycle crystal. The crystal holder is mounted in a rather small evacuated chamber 23, shown by the broken lines, after the frequency of the crystal has been adjusted. Suitable terminals 24 extend out through the wall of the evacuated chamber 23. If the vacuum chamber 23 is of metal, it also should have a contact for connection to one or the other of the electrodes, or to ground, as desired.

What is claimed is:

1. A piezoelectric crystal and holder assembly comprising, a piezoelectric element of the type adapted to respond to frequency which is a function of its length-width dimensions, metallic electrodes disposed in spaced relation on opposite sides of said crystal, a pair of supports constituted of insulating material to which said electrodes are respectively secured, and spacing members interposed between said supports and said crystal, said electrode supports and said spacing members being constituted of the same crystalline material as said piezoelectric crystal element and having substantially the same temperature coefficient of expansion as said element.

2. A crystal holder comprising a piezoelectric crystal, electrodes for said crystal, an insulating spacing member of crystal material which is the same as said piezoelectric crystal and cut at such an angle that it has the same temperature coefficient as the crystal, and clamping means which has an area small in proportion to the area of said crystal.

3. A piezoelectric crystal holder comprising a piezoelectric crystal, metallic coated insulated electrodes each having depressed surfaces facing the major faces of said crystal, and insulating spacing members of piezoelectric crystal material retained in the depressed surfaces of said crystal.

4. A crystal holder of the type wherein the crystal oscillates in the length-width mode, comprising a rectangular piezoelectric crystal, rectangular electrodes for said crystal, an insulating spacing member of piezoelectric crystal material interposed between said electrodes and said crystal, an insulating bead held between said spacing members and said crystal, and clamping means for retaining said piezoelectric crystal, spacing members and electrodes in operative position.

5. A piezoelectric crystal holder comprising a piezoelectric crystal, metallic coated insulated electrodes each having depressed surfaces facing the major faces of said crystal, insulating spacing members of piezoelectric crystal material retained in the depressed surfaces of said crystal, and an insulating member having a slotted portion therein and clamping means in said insulating member for retaining said crystal and electrodes in operative position.

6. A piezoelectric crystal holder comprising a piezoelectric crystal, metallic coated insulated electrodes each having depressed surfaces facing the major faces of said crystal, insulating spacing members of piezoelectric crystal material retained in the depressed surfaces of said crystal, an insulating crystal holder member having a slotted portion therein and clamping means in said insulating member for retaining said crystal and electrodes in operative position, and terminal means passing through portions of said insulating member for making electrical connection to the electrodes.

7. A crystal holder according to claim 6, wherein the crystal holder member is enclosed within a vacuum chamber.

RALPH E. FRANKLIN.
WILLIAM A. MILLER.

REFERENCES CITED

The following references are of record in the file of this patent:

UNITED STATES PATENTS

| Number | Name | Date |
|---|---|---|
| 2,032,865 | Bieling | Mar. 3, 1936 |
| 2,147,712 | Mason | Feb. 21, 1939 |
| 2,247,627 | Atwood et al. | July 1, 1941 |
| 2,312,746 | Bokovoy et al. | Mar. 2, 1943 |